(12) United States Patent
Park et al.

(10) Patent No.: US 8,400,601 B2
(45) Date of Patent: Mar. 19, 2013

(54) FLAT PANEL DISPLAY DEVICE AND METHOD OF MANUFACTURING THE SAME

(75) Inventors: Jong-Hyun Park, Yongin (KR); Chun-Gi You, Yongin (KR); Sun Park, Yongin (KR); Yul-Kyu Lee, Yongin (KR); Jin-Hee Kang, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 274 days.

(21) Appl. No.: 12/957,246

(22) Filed: Nov. 30, 2010

(65) Prior Publication Data

US 2011/0128490 A1    Jun. 2, 2011

(30) Foreign Application Priority Data

Dec. 1, 2009    (KR) .................. 10-2009-0117878

(51) Int. Cl.
*G02F 1/1333* (2006.01)
*G02F 1/136* (2006.01)
(52) U.S. Cl. ............. 349/138; 349/42; 349/43; 349/158
(58) Field of Classification Search .................. 349/138, 349/42, 43, 158
See application file for complete search history.

(56) References Cited

U.S. PATENT DOCUMENTS

| 5,844,647 A | 12/1998 | Maruno et al. |
| 6,356,318 B1 | 3/2002 | Kawahata |
| 6,953,949 B2 | 10/2005 | Murade |

(Continued)

FOREIGN PATENT DOCUMENTS

| CN | 101354513 A | 1/2009 |
| EP | 2 023 194 A1 | 2/2009 |

(Continued)

OTHER PUBLICATIONS

Korean Office Action dated Nov. 30, 2011 for Korean Patent Application No. KR 10-2009-0121773 corresponding to U.S. Appl. No. 12/957,233, filed Nov. 30, 2010, which is related to captioned U.S. Appl. No. 12/957,246.

(Continued)

*Primary Examiner* — Mike Qi
(74) *Attorney, Agent, or Firm* — Knobbe, Martens, Olson & Bear LLP

(57) ABSTRACT

A flat panel display device and a method of manufacturing the flat panel display device are disclosed. In one embodiment, the flat panel display device includes: i) a first substrate, ii) an active layer formed over the first substrate, wherein the active layer comprises a source region, a drain region, and a channel region, iii) a gate insulating layer formed on the active layer, iv) a gate electrode formed on the gate insulating layer and over the channel region of the active layer and v) a first interlayer insulating film formed on the gate insulating layer and the gate electrode. The device may further includes 1) a source electrode and a drain electrode electrically connected to the source region and the drain region of the active layer, respectively, through a contact hole, wherein the contact hole is formed in the first interlayer insulating film and the gate insulating layer, 2) a second interlayer insulating film interposed substantially only between i) the first interlayer insulating film and ii) the source electrode and the drain electrode, 3) a passivation layer formed on the first interlayer insulating film and the source electrode and the drain electrode and 4) a pixel electrode electrically connected to the source electrode or the drain electrode through a via-hole formed in the passivation layer.

20 Claims, 6 Drawing Sheets

U.S. PATENT DOCUMENTS

| | | | |
|---|---|---|---|
| 7,202,115 | B2 | 4/2007 | Hirano et al. |
| 7,335,917 | B2 | 2/2008 | Koo et al. |
| 7,619,695 | B2 | 11/2009 | Nomura et al. |
| 7,652,291 | B2 * | 1/2010 | Koo et al. .................. 257/72 |
| 7,839,462 | B2 | 11/2010 | Lin |
| 2005/0189535 | A1 * | 9/2005 | Hsueh et al. ................ 257/40 |
| 2007/0170845 | A1 * | 7/2007 | Choi et al. ................ 313/504 |
| 2007/0273800 | A1 | 11/2007 | Nomura et al. |
| 2010/0062553 | A1 * | 3/2010 | Sung et al. ................. 438/28 |
| 2010/0117073 | A1 | 5/2010 | Yamazaki et al. |
| 2012/0007083 | A1 | 1/2012 | You et al. |
| 2012/0080663 | A1 | 4/2012 | Lee et al. |

FOREIGN PATENT DOCUMENTS

| | | |
|---|---|---|
| JP | 2000-091585 A | 3/2000 |
| JP | 2001-242803 A | 9/2001 |
| JP | 2005-031251 A | 2/2005 |
| JP | 2005-209583 A | 8/2005 |
| JP | 2009-076890 A | 4/2009 |
| KR | 10-2004-0055223 A | 6/2004 |
| KR | 10-0482328 B1 | 3/2005 |
| KR | 10-2005-0072700 A | 7/2005 |
| KR | 10-2006-0078581 A | 7/2006 |
| KR | 10-0674238 B1 | 1/2007 |
| KR | 1020070025151 | 3/2007 |
| KR | 10-0708722 B1 | 4/2007 |
| KR | 10-2007-0115355 A | 12/2007 |
| KR | 10-2008-0097056 A | 11/2008 |
| KR | 10-0867926 B1 | 11/2008 |
| KR | 10-2009-0116131 A | 11/2009 |

OTHER PUBLICATIONS

Chinese Office Action dated Mar. 27, 2012 for Chinese Patent Application No. CN 201010222035.1 which shares priority of Korean Patent Application No. KR 10-2009-0100197 with U.S. Appl. No. 12/792,639, filed Jun. 2, 2010, which is related to captioned U.S. Appl. No. 12/957,246.

Korean Office Action dated Jul. 29, 2011 for Korean Patent Application No. KR 10-2009-0100197 corresponding to U.S. Appl. No. 12/792,639 which is related to captioned U.S. Appl. No. 12/957,246.

Korean Office Action dated Jun. 28, 2011 for Korean Patent Application No. KR 10-2009-0117878 which corresponds to captioned U.S. Appl. No. 12/957,246.

Office Action dated Jul. 17, 2012 for U.S. Appl. No. 12/792,639, filed Jun. 2, 2010, which is related to captioned U.S. Appl. No. 12/957,246.

Korean Office Action dated Mar. 21, 2011 for Korean Patent Application No. KR 10-2009-0117878 which corresponds to the captioned application.

Korean Office Action dated Mar. 21, 2011 for Korean Patent Application No. KR 10-2009-0121773 corresponding to U.S. Appl. No. 12/957,233, filed Nov. 30, 2010, which is related to the captioned application.

Japanese Office Action dated Jun. 5, 2012 for Japanese Patent Application No. JP 2010-108551 corresponding to Korean Patent Application No. KR 10-2009-0100197 which corresponds to U.S. Appl. No. 12/792,639, filed Jun. 2, 2010, which is related to captioned U.S. Appl. No. 12/957,246.

Notice of Allowance dated Nov. 5, 2012 for U.S. Appl. No. 12/957,233, filed Nov. 30, 2010, which is related to captioned U.S. Appl. No. 12/957,246.

Notice of Allowance dated Nov. 15, 2012 for U.S. Appl. No. 12/792,639, filed Jun. 2, 2010, which is related to captioned U.S. Appl. No. 12/957,246.

* cited by examiner

FIG. 5

| | | STRUCTURE OF FIG. 4 | | | | | | STRUCTURE OF FIG. 1 | | | | | | |
|---|---|---|---|---|---|---|---|---|---|---|---|---|---|---|
| | | #1 | #2 | #3 | #4 | #5 | AVG | #1 | #2 | #3 | #4 | #5 | AVG | T Incrse |
| RED | x | 0.6305 | 0.6324 | 0.6296 | 0.6321 | 0.6293 | 0.6308 | 0.6338 | 0.6337 | 0.6329 | 0.633 | 0.6332 | 0.6333 | |
| | y | 0.3405 | 0.3363 | 0.3401 | 0.3374 | 0.3398 | 0.3388 | 0.338 | 0.3379 | 0.3381 | 0.3379 | 0.3384 | 0.3381 | |
| | X | 3132486 | 3044884 | 3040775 | 3141809 | 3117051 | 3095401 | 3323172 | 3339323 | 3321030 | 3413684 | 3428245 | 3365291 | |
| | Y | 1691657 | 1619239 | 1642633 | 1677146 | 1683006 | 1662736 | 1772035 | 1780844 | 1773889 | 1821892 | 1832450 | 1796222 | |
| | Z | 143847 | 150856 | 145984 | 151342 | 153522 | 149110 | 148265 | 149448 | 152088 | 156997 | 154111 | 152182 | |
| | T | 23.18% | 22.19% | 22.51% | 22.98% | 23.06% | 22.78% | 24.28% | 24.40% | 24.31% | 24.96% | 25.11% | 24.61% | 8.03% |
| | 100% | RED Pixel * Normal TFT | | | | | | RED Pixel SiNx open TFT | | | | | | |
| GREEN | x | 0.3253 | 0.3263 | 0.324 | 0.3241 | 0.3245 | 0.3248 | 0.3211 | 0.3148 | 0.3171 | 0.3153 | 0.3131 | 0.3163 | |
| | y | 0.5548 | 0.5544 | 0.5545 | 0.5546 | 0.5553 | 0.5547 | 0.5600 | 0.5567 | 0.5566 | 0.5571 | 0.5601 | 0.5581 | |
| | X | 2241160 | 2236882 | 2243255 | 2312034 | 2329657 | 2272598 | 2255447 | 2131652 | 2191204 | 2267064 | 2226338 | 2214341 | |
| | Y | 3822975 | 3800360 | 3839482 | 3956678 | 3987130 | 3881325 | 3933099 | 3769562 | 3845566 | 4005491 | 3981749 | 3907093 | |
| | Z | 826374 | 817297 | 840920 | 864988 | 863522 | 842620 | 835302 | 8706377 | 872622 | 917936 | 901526 | 2446753 | |
| | T | 52.38% | 52.07% | 52.61% | 54.21% | 54.63% | 53.18% | 53.89% | 51.65% | 52.69% | 54.88% | 54.56% | 53.53% | 0.66% |
| | 100% | RED Pixel * Normal TFT | | | | | | RED Pixel SiNx open TFT | | | | | | |
| BLUE | x | 0.1418 | 0.1421 | 0.1417 | 0.1417 | 0.1416 | 0.1418 | 0.1409 | 0.1407 | 0.1397 | 0.1395 | 0.1400 | 0.1402 | |
| | y | 0.1814 | 0.1802 | 0.1795 | 0.1798 | 0.1822 | 0.1806 | 0.1890 | 0.1786 | 0.1848 | 0.1844 | 0.1865 | 0.1847 | |
| | X | 839587 | 838540 | 857503 | 881592 | 872596 | 857964 | 828883 | 868842 | 845881 | 887902 | 876595 | 861621 | |
| | Y | 10738830 | 1063233 | 1086165 | 1118171 | 1122776 | 1092835 | 1112048 | 1102876 | 1118969 | 1173175 | 1167441 | 1134902 | |
| | Z | 4007303 | 3999703 | 4107579 | 4219969 | 4166728 | 4100256 | 3943210 | 4204727 | 4090870 | 4302560 | 4216210 | 4151515 | |
| | T | 14.71% | 14.57% | 14.88% | 15.32% | 15.38% | 14.97% | 15.24% | 15.11% | 15.33% | 16.07% | 16.00% | 15.55% | 3.71% |

FLAT PANEL DISPLAY DEVICE AND METHOD OF MANUFACTURING THE SAME

CROSS-REFERENCE TO RELATED APPLICATIONS

This application claims priority to and the benefit of Korean Patent Application No. 10-2009-0117878, filed on Dec. 1, 2009, in the Korean Intellectual Property Office, the entire content of which is incorporated herein by reference. This application relates to U.S. patent applications Ser. No. 12/792,639 filed on Jun. 2, 2010. This application also repates to "Display Device and Method of Manufacturing the Same" (Ser. No. 12/957,233), which is concurrently filed with this application and incorporated herein by reference in its entirety.

BACKGROUND

1. Field of the Invention

Disclosed embodiments of the technology relate to a flat panel display device and a method of manufacturing the same, in more detail, a flat panel display device that has improved light transmittance of the display panel and a method of manufacturing the flat panel display device.

2. Discussion of the Related Technology

The classes of flat panel display devices include a liquid crystal display device using electrical-optical properties of liquid crystal and an organic light emitting display device using self emission properties of an organic light emitting diode. The flat panel display devices are divided into a passive matrix type and an active matrix type. The active matrix type including a thin film transistor has excellent resolution and video implementation ability and is more widely used than the passive matrix type.

SUMMARY OF CERTAIN INVENTIVE ASPECTS

One aspect is a flat panel display device having improved light transmittance of the display panel and a method of manufacturing the flat panel display device.

Another aspect is a flat panel display device which includes: a first substrate; an active layer that is formed on the first substrate and includes a source region, a drain region, and a channel region; a gate insulating layer that is formed on the first substrate including the active layer; a gate electrode that is formed on the gate insulating layer over the channel region; a first interlayer insulating film that is formed on the gate insulating layer including the gate electrode; a source electrode and a drain electrode that are connected with the active layer in the source region and the drain region through a contact hole formed in the first interlayer insulating film and the gate insulating film; a second interlayer insulating film that is interposed between the first interlayer insulating film and the source electrode and the drain electrode; a passivation layer that is formed on the first interlayer insulating film including the source electrode and the drain electrode; and a pixel electrode that is connected with the source electrode or the drain electrode through a via-hole formed in the passivation layer.

Another aspect is a method of manufacturing a flat panel display device which includes: forming an active layer including a source region, a drain region, and a channel region on a first substrate; forming a gate insulating layer on the first substrate including the active layer; forming a gate electrode on the gate insulating layer above the channel region; forming a first interlayer insulating film on the gate insulating layer including the gate electrode; foaming a second interlayer insulating film having a smaller thickness than the first interlayer insulating film on the first interlayer insulating film; performing heat treatment; exposing the active layer in the source region and the drain region by patterning the second interlayer insulating film, the first interlayer insulating film, and the gate insulating layer; forming a source electrode and a drain electrode to be connected with the active layer in the source region and the drain region, on the second interlayer insulating film; removing the second interlayer insulating film in the exposed portion; forming a passivation layer on the first interlayer insulating film including the source electrode and the drain electrode; exposing the source electrode or the drain electrode by patterning the passivation layer; and forming a pixel electrode to be connected with the source electrode or the drain electrode, on the passivation layer.

An interlayer insulating film is formed between source and drain electrodes and a gate electrode to minimize signal interference in a flat panel display device including a thin film transistor. However, the interlayer insulating film deteriorates light transmittance of the display panel, because it includes a silicon nitride film having low light transmittance.

In one embodiment, it is possible to improve light transmittance of a display panel by forming interlayer insulating films of a silicon oxide film and a silicon nitride film and removing the silicon nitride film in a light-transmitting region without using a specific mask in the process of forming source and drain electrodes.

Further, in one embodiment of the present invention, the silicon nitride film is not broken, even if heat treatment is performed after an interlayer insulating film is formed, by making the silicon nitride film thinner than the silicon oxide film. Furthermore, electrical properties of the active layer can be improved by diffusion of hydrogen contained in the silicon nitride film.

Another aspect is a flat panel display device, comprising: a first substrate; an active layer formed over the first substrate, wherein the active layer comprises a source region, a drain region, and a channel region; a gate insulating layer formed on the active layer; a gate electrode formed on the gate insulating layer and over the channel region of the active layer; a first interlayer insulating film formed on the gate insulating layer and the gate electrode; a source electrode and a drain electrode electrically connected to the source region and the drain region of the active layer, respectively, through a contact hole, wherein the contact hole is formed in the first interlayer insulating film and the gate insulating layer; a second interlayer insulating film interposed substantially only between i) the first interlayer insulating film and ii) the source electrode and the drain electrode; a passivation layer formed on the first interlayer insulating film and the source electrode and the drain electrode; and a pixel electrode electrically connected to the source electrode or the drain electrode through a via-hole formed in the passivation layer.

The above device further comprises: a second substrate disposed to face the first substrate; a common electrode formed on the second substrate and over the pixel electrode; and a liquid crystal layer interposed between the first substrate and the second substrate. The above device further comprises: a pixel defining layer formed on the passivation layer and a first portion of the pixel electrode; an organic light emitting layer formed on a second portion of the pixel electrode and part of the pixel defining layer, wherein the first and second portions of the pixel electrode do not overlap with each other; and a cathode electrode formed on the organic light emitting layer and pixel defining layer.

In the above device, the second interlayer insulating film is thinner than the first interlayer insulating film. In the above device, the thickness of the second interlayer insulating film is about 60% to about 80% of the thickness of the first interlayer insulating film. In the above device, the first interlayer insulating film is formed of silicon oxide and wherein the second interlayer insulating film is formed of silicon nitride. In the above device, the active layer is formed of polysilicon. In the above device, the pixel electrode is formed of a transparent conductive material. The above device further comprises a buffer layer interposed between i) the first substrate and ii) the gate insulating layer and active layer. In the above device, the second interlayer insulating film is not formed between the source and drain electrodes.

Another aspect is a method of manufacturing a flat panel display device, comprising: forming an active layer over a first substrate, wherein the active layer comprises a source region, a drain region, and a channel region; forming a gate insulating layer on the active layer; forming a gate electrode on the gate insulating layer to be substantially directly above the channel region of the active layer; forming a first interlayer insulating film on the gate insulating layer and the gate electrode; forming a second interlayer insulating film on the first interlayer insulating film, wherein the second interlayer insulating film is thinner than the first interlayer insulating film; performing heat treatment on i) the first and second interlayer insulating films, ii) the gate electrode, iii) the gate insulating layer and iv) the active layer; patterning the first and second interlayer insulating films and the gate insulating layer so as to expose the source region and the drain region of the active layer; forming a source electrode and a drain electrode on the exposed portion so that the source and drain electrodes are electrically connected to the active layer; patterning the second interlayer insulating film so that the remaining portion of the second interlayer insulating film is formed substantially only between i) the first interlayer insulating film and ii) the source and drain electrodes; forming a passivation layer on the first interlayer insulating film and the source electrode and the drain electrode; patterning the passivation layer so as to expose the source electrode or the drain electrode; and forming a pixel electrode on the passivation layer so as to be connected to the source electrode or the drain electrode.

The above method further comprises: forming a common electrode on a second substrate and over the pixel electrode; disposing the first substrate and the second substrate to face each other; forming a sealant along the edges of the first substrate and the second substrate; and injecting liquid crystal into a space between the first substrate and the second substrate.

The above method further comprises: forming a pixel defining layer on the passivation layer and the pixel electrode; exposing the pixel electrode in a light emitting region; forming an organic light emitting layer on the exposed portion of the pixel electrode; and forming a cathode electrode on the organic light emitting layer and pixel defining layer. In the above method, the second interlayer insulating film is not formed in the light emitting region. In the above method, the thickness of the second interlayer insulating film is about 60% to about 80% of the thickness of the first interlayer insulating film. In the above method, the first interlayer insulating film is formed of silicon oxide and wherein the second interlayer insulating film is formed of silicon nitride. In the above method, the second interlayer insulating film in the exposed portion is removed by dry etching that uses the source electrode and the drain electrode as a mask.

Another aspect is a flat panel display device, comprising: a substrate, wherein a pixel region and a non-pixel region are formed in or over the substrate, and wherein the pixel region is configured to emit light; an active layer formed over the first substrate, wherein a source region, a drain region and a channel region are formed in the active layer; a gate insulating layer formed on the active layer; a gate electrode formed on the gate insulating layer and over the channel region of the active layer; a first interlayer insulating film formed on the gate insulating layer and the gate electrode; a source electrode and a drain electrode electrically connected to the source region and the drain region of the active layer, respectively; and a second interlayer insulating film formed on the first interlayer insulating film, wherein the second interlayer insulating film is not substantially formed in the pixel region.

In the above device, the second interlayer insulating film is interposed only between i) the first interlayer insulating film and ii) the source electrode and the drain electrode. In the above device, the second interlayer insulating film is thinner than the first interlayer insulating film.

BRIEF DESCRIPTION OF THE DRAWINGS

FIG. 5 is a table illustrating measurement of light transmittance.

DETAILED DESCRIPTION OF EXEMPLARY EMBODIMENTS

Figure 1:
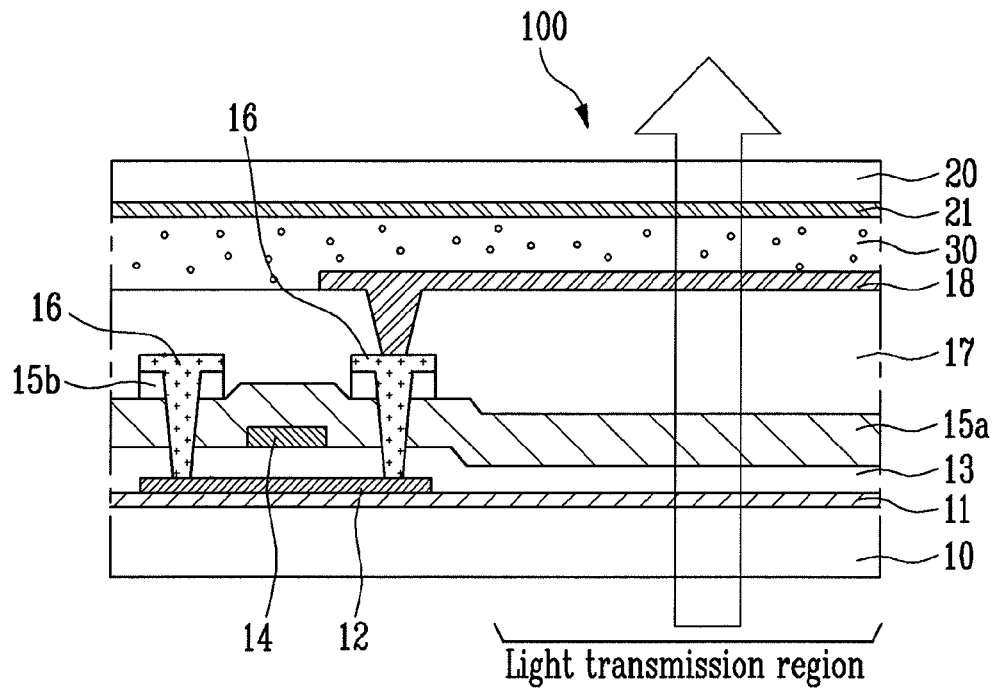
FIGS. 1 and 2 are a cross-sectional views illustrating a flat panel display device according to one embodiment of the present invention.

Active matrix type liquid crystal display devices (TFT-LCD) generally include i) a display panel having two substrates with liquid crystal therebetween, ii) a backlight unit that is disposed on the backside of the display panel and used as a light source, and iii) a drive IC that drives the display panel. Light generated by the backlight travels into the display panel, modulated by liquid crystals aligned in response to a signal supplied from the drive IC, and then emitted to the environment, thereby displaying characters or images.

Further, active matrix type organic light emitting display devices include a display panel having an organic light emitting diode and a drive IC that drives the display panel. Light generated by the organic light emitting diode is emitted outside in response to a signal supplied from the drive IC, thereby displaying characters or images.

In flat panel display devices, such as the liquid crystal display device and the organic light emitting display device, the light transmittance of the display panel may significantly influence the luminance.

However, the active matrix type flat panel displays include a thin film transistor, where insulating layers, such as a silicon oxide film and a silicon nitride film, are stacked in the pixel region (or light-emitting region) on the substrate, through which light is transmitted, in the manufacturing process. Therefore, light transmittance is reduced by the insulating layers, resulting in reduced luminance.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Embodiments of the present invention will be described hereafter in detail with reference to the accompanying drawings.

FIG. 1 is a cross-sectional view illustrating a flat panel display device 100 according to one embodiment of the present invention. In one embodiment, as shown in FIG. 1, the flat panel display device 100 is a liquid crystal display device.

Referring to FIG. 1, a buffer layer 11 is formed on a lower substrate 10 and an active layer 12 providing a source region, a drain region, and a channel region of a thin film transistor is formed on the buffer layer 11. A gate insulating layer 13 is formed on the buffer layer 11 and the active layer 12. A gate electrode 14 is formed on the gate insulating layer 13 over the channel region. A first interlayer insulating film 15a is formed on the gate insulating layer 13 and the gate electrode 14. Source and drain electrodes 16 electrically connected to the active layer 12 of the source region and the drain region through contact holes are formed on the first interlayer insulating film 15a. In one embodiment, a second interlayer insulating film 15b is formed only between the first interlayer insulating film 15a and the source and drain electrodes 16. In one embodiment, the second interlayer insulating film 15b is not formed in the pixel region. A passivation layer 17 is formed on the first interlayer insulating film 15a and the source and drain electrodes 16. A pixel electrode 18, connected to the source or drain electrode 16 through a via-hole, is formed on the passivation layer 17.

An upper substrate 20 with a common electrode 21 is disposed over the lower substrate 10 having the above configuration and a liquid crystal layer 30 is disposed between the lower substrate 10 and the upper substrate 20.

In the liquid crystal display device, light generated by the backlight disposed on the backside of the lower substrate 10 travels into the display panel 100, modulated by the liquid crystal layer 30 aligned by a voltage applied from a drive IC to the pixel 18 and the common electrode 21. Then, the modulated light is emitted to the outside through the upper substrate 20, thereby displaying characters or images.

Figure 2:
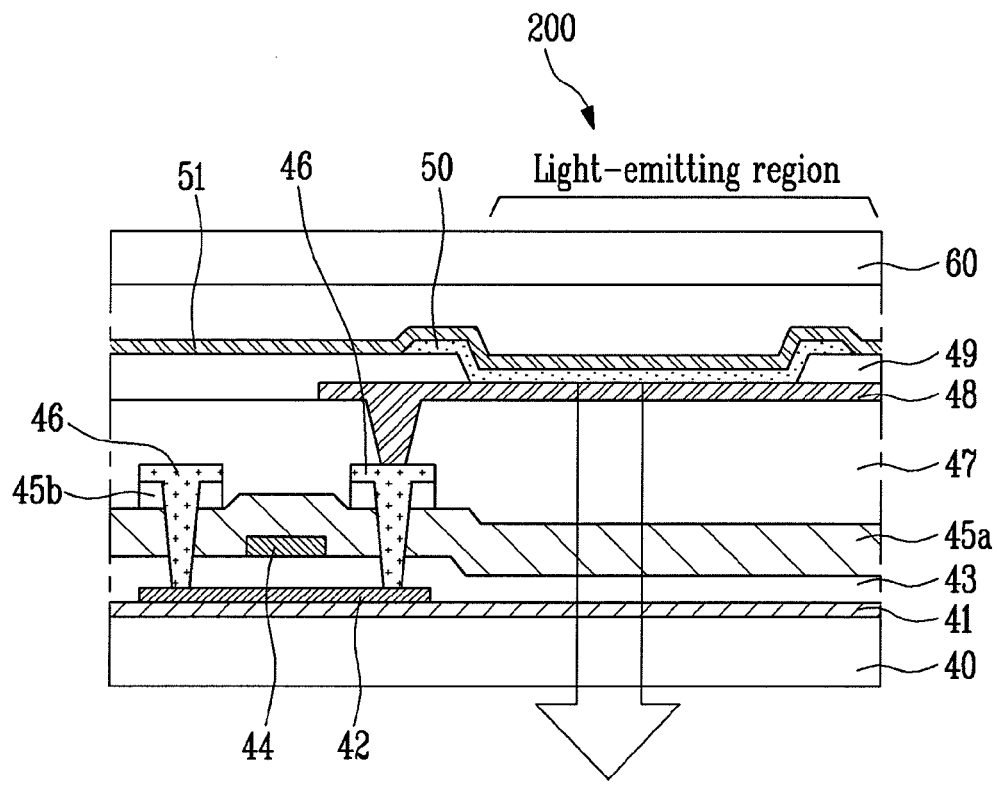

FIG. 2 is a cross-sectional view illustrating a flat panel display device according to another embodiment of the present invention. In one embodiment, as shown in FIG. 1, the flat panel display device 200 is an organic light emitting display device.

Referring to FIG. 2, a buffer layer 41 is formed on a lower substrate 40 and an active layer 42 providing a source region, a drain region, and a channel region of a thin film transistor is formed on the buffer layer 41. A gate insulating layer 43 is formed on the buffer layer 41 and the active layer 42. A gate electrode 44 is formed on the gate insulating layer 43 over the channel region. A first interlayer insulating film 45a is formed on the gate insulating layer 43 and the gate electrode 44. Source and drain electrodes 46, electrically connected to the active layer 42 of the source region and the drain region through contact holes, are formed on the first interlayer insulating film 45a. In one embodiment, a second interlayer insulating film 45b is formed only between the first interlayer insulating film 45a and the source and drain electrodes 46. In one embodiment, the second interlayer insulating film 45b is not formed in the pixel region. A passivation layer 47 is formed on the first interlayer insulating film 45a and the source and drain electrodes 16. A pixel electrode 48, connected to the source or drain electrode 46 through a via-hole, is formed on the passivation layer 47.

A pixel defining layer 49 is formed on the passivation layer 47 and the pixel electrode 48 such that the pixel electrode 48 in a light emitting region is exposed and an organic light emitting layer 50 is formed on the exposed pixel electrode 48. A cathode electrode 51 is formed on the pixel defining layer 49 and the organic light emitting layer 50.

A sealing substrate 60 is disposed over the lower substrate 40 having the above configuration and the lower substrate 40 and the sealing substrate 60 are bonded by a sealant.

In the organic light emitting display device, holes injected through the pixel electrode 48 and electrons injected through the cathode electrode 51 are recombined in the organic light emitting layer 50, when a predetermined voltage is applied to the pixel electrode 48 and the cathode electrode 51. Light emitted from the organic light emitting layer 50 by an energy difference generated in this process is emitted to the outside through the lower substrate 40, thereby displaying characters or images.

FIGS. 3A to 3G are cross-sectional views illustrating a method of manufacturing a flat panel display device according to one embodiment of the present invention.

Figure 3A:
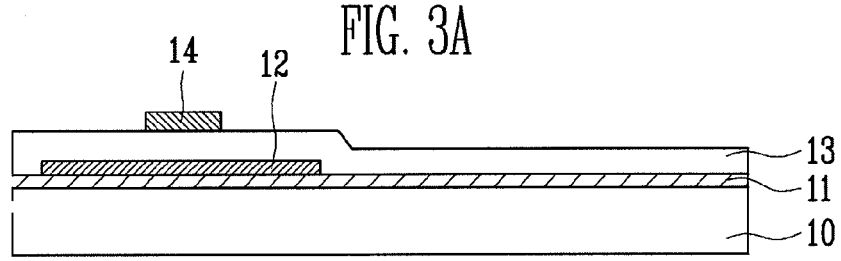
FIGS. 3A to 3G are cross-sectional views illustrating a method of manufacturing a flat panel display device according to one embodiment of the present invention.

Referring to FIG. 3A, a buffer layer 11 is formed on a substrate 10 and an active layer 12 providing a source region, a drain region, and a channel region of a thin film transistor is formed on the buffer layer 11. A gate insulating layer 13 is formed on the buffer layer 11 and the active layer 12. A gate electrode 14 is formed on the gate insulating layer 13 over the channel region.

A transparent substrate, such as glass and plastic, is used as the substrate 10. In one embodiment, the active layer 12 is formed of a semiconductor, such as polysilicon, and if needed, crystallization and ion injection are performed.

Figure 3B:
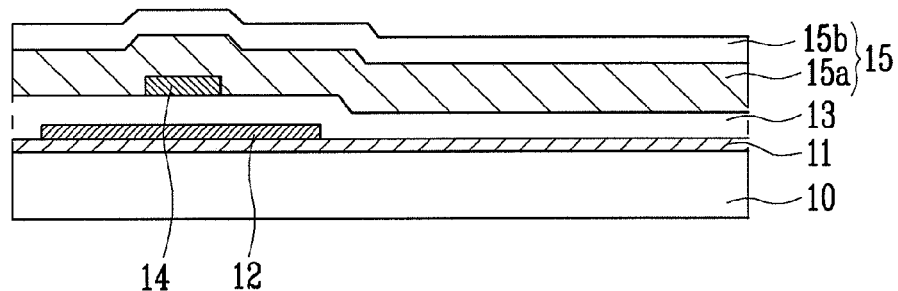

Referring to FIG. 3B, an interlayer insulating film 15 is formed on the gate insulating layer 13 and the gate electrode 14. In one embodiment, the interlayer insulating film 15 includes a first interlayer insulating film 15a and a second interlayer insulating film 15b stacked to prevent signal interference between the gate electrode and source and drain electrodes 16. In one embodiment, the second interlayer insulating film 15b is formed thinner than the first interlayer insulating film 15a, for example, formed to have a thickness of about 60% to about 80% of that of the first interlayer insulating film 15a. The first interlayer insulating film 15a may be formed of a silicon oxide film (SiO) having a thickness of about 3000 Å and the second interlayer insulating film 15b may be formed of a silicon nitride film (SiN) having a thickness of about 2000 Å to about 2600 Å.

Figure 3C:
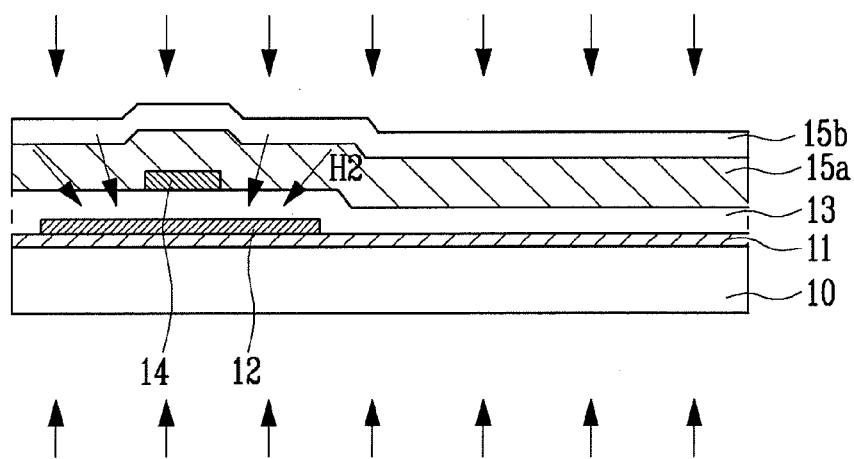

Referring to FIG. 3C, rapid thermal annealing is performed to recrystallize the active layer 12. Hydrogen atoms (H) contained in the silicon nitride film (SiN) 15b are diffused into the active layer 12 and combined with the silicon dangling bond by high-temperature heat treatment, such that defects of the active layer 12 are removed. Accordingly, electrical properties, such as surface resistance, mobility, and degree of scattering, can be improved.

The silicon nitride film may be cracked or deformed by a difference in coefficient of thermal expansion at high temperature, when having a thickness over about 4000 Å, because the film is generally hard. However, in one embodiment, since the silicon nitride film 15b is formed relatively thin, it is not cracked or deformed in the high-temperature heat treatment. Therefore, the heat treatment can be performed after the interlayer insulating film 15 is formed, such that it is possible to improve electrical properties by diffusion of the hydrogen (H) atoms, as described above. If the heat treatment is performed before the interlayer insulating film 15 is formed, the gate electrode 14 may be oxidized and it is difficult to expect improvement of the electrical properties by diffusion of the hydrogen (H) atoms.

Figure 3D:
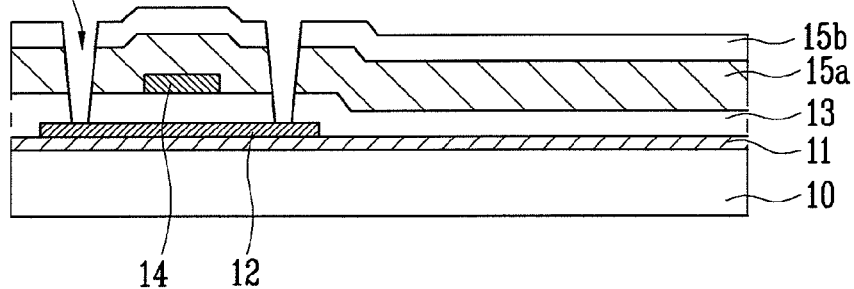

Referring to FIG. 3D, a contact hole 15c is formed such that the active layer 12 in the source region and the drain region is exposed, by patterning the second interlayer insulating film 15b, the first interlayer insulating film 15a, and the gate insulating layer 13.

Figure 3E:
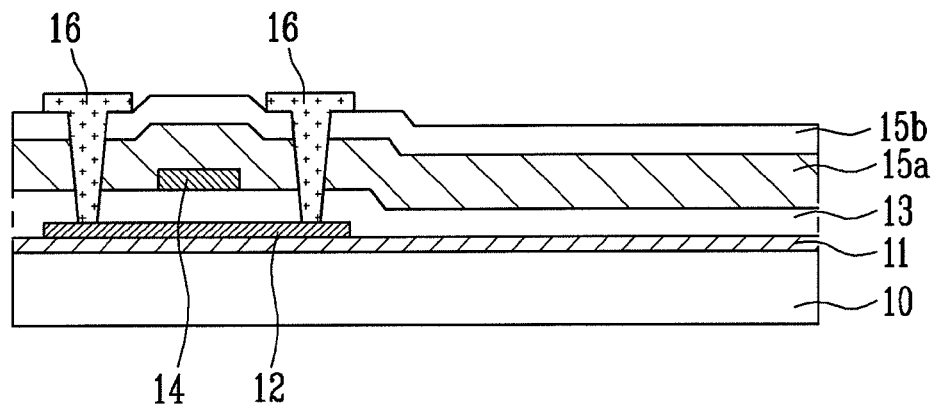

Referring to FIG. 3E, the source and drain electrodes 16 connected to the active layer 12 in the source region and the drain region are formed by forming a metal layer on the second interlayer insulating film 15b such that the contact hole 15c is filled, and then patterning the metal layer. The metal layer may be formed of titanium (Ti) or a stack of aluminum (Al) and titanium (Ti), and may be patterned by a chlorine (Cl)-based gas.

Figure 3F:
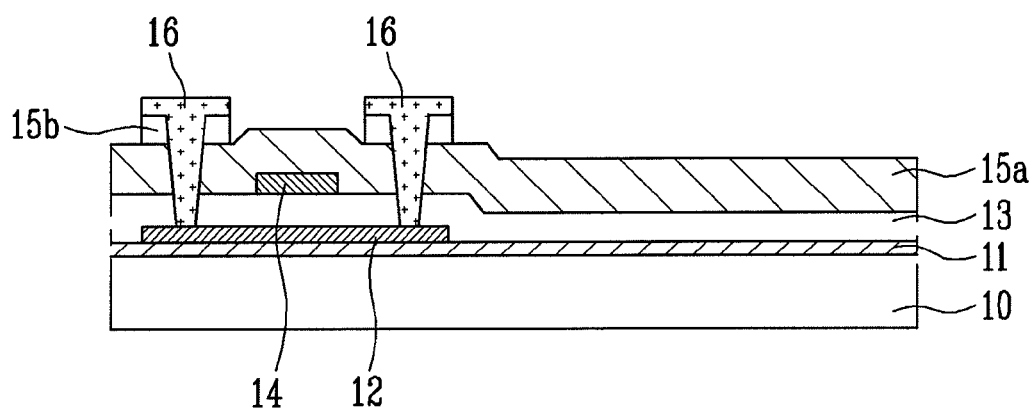

Referring to FIG. 3F, the portion of the second interlayer insulating film 15b, which has been exposed by dry etching that uses the source and drain electrodes 16 as a mask, is removed. In this process, a difference in etch ratio is large between the silicon oxide film 15a and the silicon nitride film 15b, such that etching that uses a fluorine (SF6)-based gas can easily remove chlorine (Cl)-based residuum without damaging the silicon oxide film 15a.

Figure 3G:
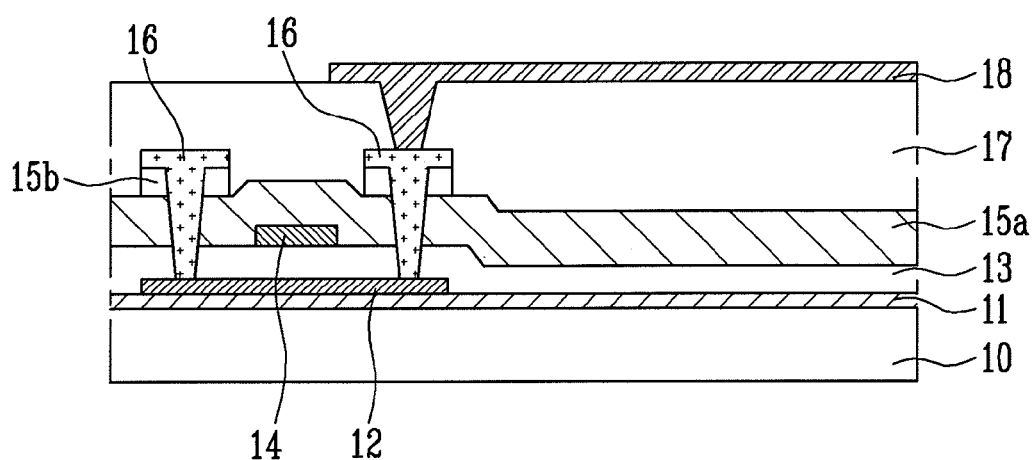

Referring to FIG. 3G, a via-hole is formed such that the source or drain electrode 16 is exposed, by forming a passivation layer 17 on the first interlayer insulating film 15a and the source and drain electrodes 16 and the patterning the passivation layer 17. A pixel electrode 18 connected to the source or drain electrode 16 is formed by forming a transparent conductive layer, such as ITO and IZO, on the passivation layer 17 such that the via-hole is filled, and then patterning the conductive layer.

Referring again to FIG. 1, a common electrode 21 is formed on the upper substrate 20. The lower substrate 10 and the upper substrate 20 are arranged to face each other and a sealant (not shown) is formed along the edges of the lower substrate 10 and the upper substrate 20. Thereafter, the display panel 100 of the liquid crystal display device is completed by injecting the liquid crystal layer 30 into a space between the lower substrate 10 and the upper substrate 20.

Further, referring again to FIG. 2, a pixel defining layer 49 is formed on the passivation layer 47 and the pixel electrode 48 and then the pixel electrode 48 in the light emitting region is exposed. An organic light emitting layer 50 is formed on the exposed pixel electrode 48 and a cathode electrode 51 is formed on the pixel defining layer 49 and the organic light emitting layer 50. Thereafter, the display panel 200 of the organic light emitting display device is completed by disposing a sealing substrate 60 over the lower substrate 40 and bonding the lower substrate 40 and the sealing substrate 60 with a sealant (not shown).

In one embodiment, the interlayer insulating films are formed of the silicon oxide films 15a and 45a and the silicon nitride films 15b and 45b. Further, the silicon nitride films 15b and 45b in the light-transmitting region are removed without using a specific mask in the process of forming the source and drain electrodes 16 and 46. As the silicon nitride films 15b and 45b in the light-transmitting region are removed, the light transmittance of the display panel is improved, such that luminance and picture quality of the display device can be improved.

Figure 4:
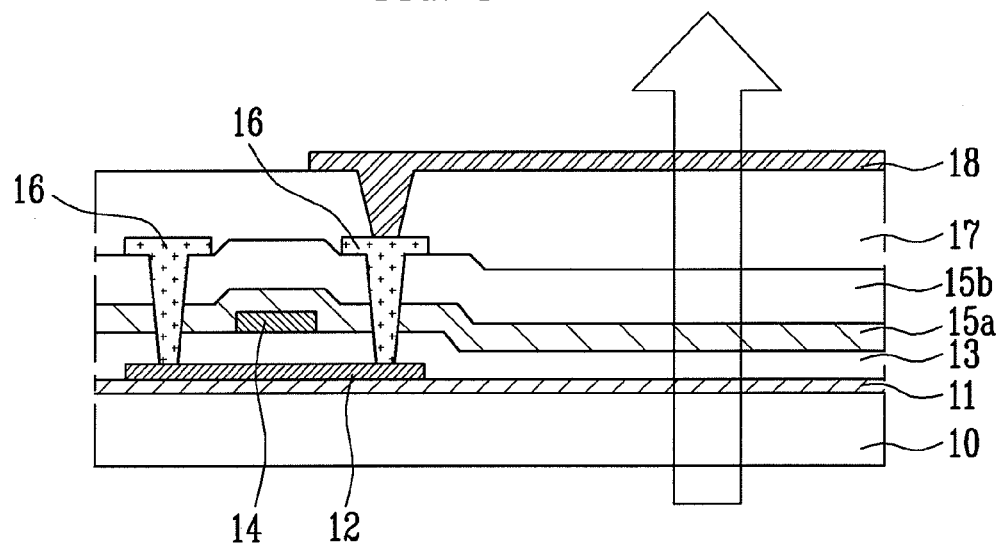
FIGS. 4 and 6 are cross-sectional views of a flat panel display device according to one embodiment of the present invention.

If the silicon nitride film 15b in the light-transmitting region is not removed, as shown in FIG. 4 (comparative example), the silicon nitride film 15b is about 7% lower in transmittance than the silicon oxide film 15a and oscillation of light increases, such that light transmittance is reduced. Since in the comparative example of FIG. 4, the silicon nitride film 15b is formed in the pixel region, light transmittance is reduced. Further, since the silicon nitride film 15b is thicker than the silicon oxide film 15a (for example, about 6000 Å vs. about 1500 Å), light transmittance is further reduced (e.g., about 85.4%).

It was seen from the result of actually measuring light transmittance, as can be seen from FIG. 5, that, for the red pixel, transmittance was improved by about 8% in the structure shown in FIG. 1 as compared with that shown in FIG. 4.

Figure 6:
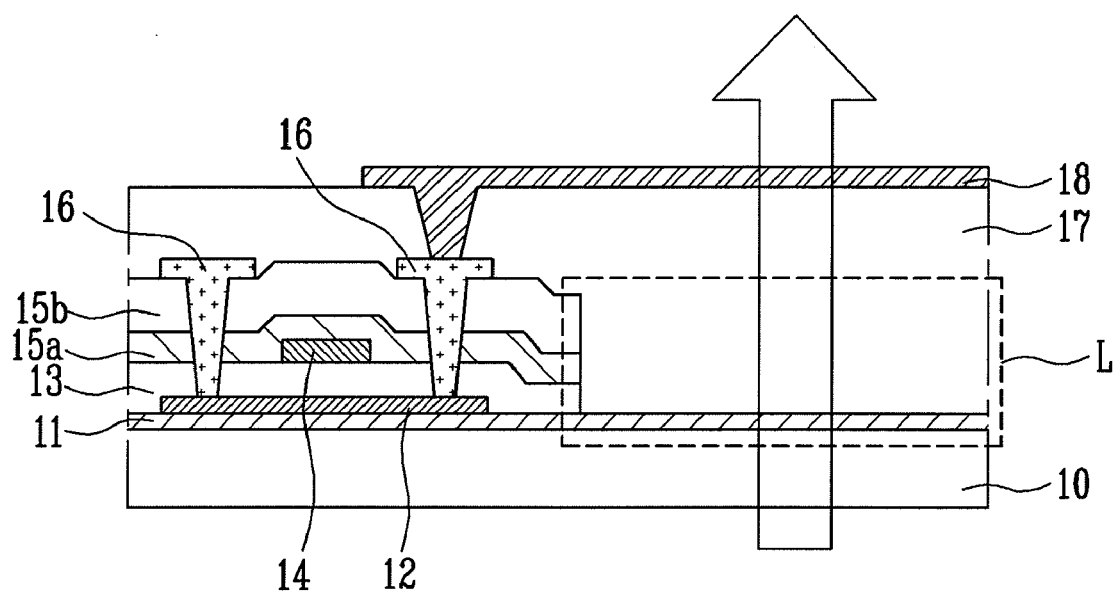

Although it is possible to improve the light transmittance by removing the silicon oxide layer 15a and the silicon nitride layer 15b in the light-transmitting region L in the structure of FIG. 4, as shown in FIG. 6, it takes a long time to etch the silicon nitride film 15b, the silicon oxide film 15a, and the gate insulating layer 13, such that productivity is deteriorated and the heat treatment effect described above may not be achieved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and-equivalents thereof.

What is claimed is:
1. A flat panel display device, comprising:
   a first substrate;
   an active layer formed over the first substrate, wherein the active layer comprises a source region, a drain region, and a channel region;
   a gate insulating layer formed on the active layer;
   a gate electrode formed on the gate insulating layer and over the channel region of the active layer;
   a first interlayer insulating film formed on the gate insulating layer and the gate electrode;
   a source electrode and a drain electrode electrically connected to the source region and the drain region of the active layer, respectively, through a contact hole, wherein the contact hole is formed in the first interlayer insulating film and the gate insulating layer;
   a second interlayer insulating film interposed substantially only between i) the first interlayer insulating film and ii) the source electrode and the drain electrode;
   a passivation layer formed on the first interlayer insulating film and the source electrode and the drain electrode; and
   a pixel electrode electrically connected to the source electrode or the drain electrode through a via-hole formed in the passivation layer.

2. The flat panel display device as claimed in claim 1, further comprising:
   a second substrate disposed to face the first substrate;
   a common electrode formed on the second substrate and over the pixel electrode; and
   a liquid crystal layer interposed between the first substrate and the second substrate.

3. The flat panel display device as claimed in claim 1, further comprising:
a pixel defining layer formed on the passivation layer and a first portion of the pixel electrode;
an organic light emitting layer formed on a second portion of the pixel electrode and part of the pixel defining layer, wherein the first and second portions of the pixel electrode do not overlap with each other; and
a cathode electrode formed on the organic light emitting layer and pixel defining layer.

4. The flat panel display device as claimed in claim 1, wherein the second interlayer insulating film is thinner than the first interlayer insulating film.

5. The flat panel display device as claimed in claim 4, wherein the thickness of the second interlayer insulating film is about 60% to about 80% of the thickness of the first interlayer insulating film.

6. The flat panel display device as claimed in claim 1, wherein the first interlayer insulating film is formed of silicon oxide and wherein the second interlayer insulating film is formed of silicon nitride.

7. The flat panel display device as claimed in claim 1, wherein the active layer is formed of polysilicon.

8. The flat panel display device as claimed in claim 1, wherein the pixel electrode is formed of a transparent conductive material.

9. The flat panel display device as claimed in claim 1, further comprising a buffer layer interposed between i) the first substrate and ii) the gate insulating layer and active layer.

10. The flat panel display device as claimed in claim 1, wherein the second interlayer insulating film is not formed between the source and drain electrodes.

11. A method of manufacturing a flat panel display device, comprising:
forming an active layer over a first substrate, wherein the active layer comprises a source region, a drain region, and a channel region;
forming a gate insulating layer on the active layer;
forming a gate electrode on the gate insulating layer to be substantially directly above the channel region of the active layer;
forming a first interlayer insulating film on the gate insulating layer and the gate electrode;
forming a second interlayer insulating film on the first interlayer insulating film, wherein the second interlayer insulating film is thinner than the first interlayer insulating film;
performing heat treatment on i) the first and second interlayer insulating films, ii) the gate electrode, iii) the gate insulating layer and iv) the active layer;
patterning the first and second interlayer insulating films and the gate insulating layer so as to expose the source region and the drain region of the active layer;
forming a source electrode and a drain electrode on the exposed portion so that the source and drain electrodes are electrically connected to the active layer; patterning the second interlayer insulating film so that the remaining portion of the second interlayer insulating film is formed substantially only between i) the first interlayer insulating film and ii) the source and drain electrodes;
forming a passivation layer on the first interlayer insulating film and the source electrode and the drain electrode;
patterning the passivation layer so as to expose the source electrode or the drain electrode; and
forming a pixel electrode on the passivation layer so as to be connected to the source electrode or the drain electrode.

12. The method of manufacturing a flat panel display device as claimed in claim 11, further comprising:
forming a common electrode on a second substrate and over the pixel electrode;
disposing the first substrate and the second substrate to face each other;
forming a sealant along the edges of the first substrate and the second substrate; and
injecting liquid crystal into a space between the first substrate and the second substrate.

13. The method of manufacturing a flat panel display device as claimed in claim 11, further comprising:
forming a pixel defining layer on the passivation layer and the pixel electrode;
exposing the pixel electrode in a light emitting region;
forming an organic light emitting layer on the exposed portion of the pixel electrode; and
forming a cathode electrode on the organic light emitting layer and pixel defining layer.

14. The method of manufacturing a flat panel display device as claimed in claim 13, wherein the second interlayer insulating film is not formed in the light emitting region.

15. The method of manufacturing a flat panel display device as claimed in claim 11, wherein the thickness of the second interlayer insulating film is about 60% to about 80% of the thickness of the first interlayer insulating film.

16. The method of manufacturing a flat panel display device as claimed in claim 11, wherein the first interlayer insulating film is formed of silicon oxide and wherein the second interlayer insulating film is formed of silicon nitride.

17. The method of manufacturing a flat panel display device as claimed in claim 11, wherein the second interlayer insulating film in the exposed portion is removed by dry etching that uses the source electrode and the drain electrode as a mask.

18. A flat panel display device, comprising:
a substrate, wherein a pixel region and a non-pixel region are formed in or over the substrate, and wherein the pixel region is configured to emit light;
an active layer formed over the first substrate, wherein a source region, a drain region and a channel region are formed in the active layer;
a gate insulating layer formed on the active layer;
a gate electrode formed on the gate insulating layer and over the channel region of the active layer;
a first interlayer insulating film formed on the gate insulating layer and the gate electrode;
a source electrode and a drain electrode electrically connected to the source region and the drain region of the active layer, respectively; and
a second interlayer insulating film formed on the first interlayer insulating film, wherein the second interlayer insulating film is not substantially formed in the pixel region.

19. The flat panel display device as claimed in claim 18, wherein the second interlayer insulating film is interposed only between i) the first interlayer insulating film and ii) the source electrode and the drain electrode.

20. The flat panel display device as claimed in claim 18, wherein the second interlayer insulating film is thinner than the first interlayer insulating film.

* * * * *